(12) United States Patent
Scaramucci et al.

(10) Patent No.: US 11,860,218 B2
(45) Date of Patent: Jan. 2, 2024

(54) ELECTRONIC MONITORING CIRCUIT FOR DETECTING THE VARIATION IN THE POWER OR CURRENT ABSORBED BY AT LEAST ONE ELECTRONIC CIRCUIT UNDER TEST AND ELECTRONIC SYSTEM FOR TESTING THE OPERATION OF THE AT LEAST ONE ELECTRONIC CIRCUIT

(71) Applicant: ELDOR CORPORATION S.P.A., Orsenigo (IT)

(72) Inventors: Ciro Scaramucci, Orsenigo (IT); Giovanni Silvestri, Orsenigo (IT); Pasquale Forte, Orsenigo (IT)

(73) Assignee: ELDOR CORPORATION S.P.A., Orsenigo (IT)

( * ) Notice: Subject to any disclaimer, the term of this patent is extended or adjusted under 35 U.S.C. 154(b) by 40 days.

(21) Appl. No.: 17/597,824

(22) PCT Filed: Jul. 24, 2020

(86) PCT No.: PCT/IB2020/057003
§ 371 (c)(1),
(2) Date: Jan. 25, 2022

(87) PCT Pub. No.: WO2021/019396
PCT Pub. Date: Feb. 4, 2021

(65) Prior Publication Data
US 2022/0260628 A1 Aug. 18, 2022

(30) Foreign Application Priority Data

Jul. 26, 2019 (IT) .......................... 102019000012984

(51) Int. Cl.
*G01R 31/28* (2006.01)
*G01R 1/04* (2006.01)
*G01R 21/07* (2006.01)

(52) U.S. Cl.
CPC ......... *G01R 31/282* (2013.01); *G01R 1/0416* (2013.01); *G01R 21/07* (2013.01)

(58) Field of Classification Search
CPC .... G01R 31/282; G01R 1/0416; G01R 21/07; G01R 19/0092; G01R 21/127; H02J 7/0063; H02J 2207/20; H02M 3/156
See application file for complete search history.

(56) References Cited

U.S. PATENT DOCUMENTS 6,646,450 B2 * 11/2003 Liebler ............... H02M 3/1588
 323/272
2009/0121703 A1 * 5/2009 Kirn ................... G01R 19/0092
 324/76.11

(Continued)

OTHER PUBLICATIONS

International Search Report and Written Opinion, European International Search Authority, dated Dec. 22, 2020, for PCT/IB2020/057003 filed Jul. 24, 2020.

*Primary Examiner* — Akm Zakaria
(74) *Attorney, Agent, or Firm* — Workman Nydegger

(57) ABSTRACT

An electronic monitoring circuit for detecting a variation in the power or current absorbed by an electronic circuit under test is disclosed. The circuit includes an input terminal adapted to receive a pulse-width modulation control signal, a resistor having a first terminal connected to the input terminal, and a capacitor having a first terminal connected to a second terminal of the resistor. The output terminal is adapted to generate an output signal as a function of the value of the voltage drop at the ends of the capacitor, said output signal being representative of a variation of the pulse width of the pulse-width modulation control signal. The variation of the pulse width is a function of the power or current absorbed by the electronic circuit under test.

17 Claims, 4 Drawing Sheets

(56) References Cited

U.S. PATENT DOCUMENTS

| | | |
|---|---|---|
| 2010/0164477 A1 | 7/2010 | Trivedi et al. |
| 2011/0115456 A1* | 5/2011 | Tanifuji ................ H02M 3/156 323/283 |
| 2011/0156687 A1* | 6/2011 | Gardner ................ H02M 3/156 323/284 |
| 2015/0061521 A1 | 3/2015 | Cohen |

* cited by examiner

ELECTRONIC MONITORING CIRCUIT FOR DETECTING THE VARIATION IN THE POWER OR CURRENT ABSORBED BY AT LEAST ONE ELECTRONIC CIRCUIT UNDER TEST AND ELECTRONIC SYSTEM FOR TESTING THE OPERATION OF THE AT LEAST ONE ELECTRONIC CIRCUIT

TECHNICAL FIELD OF THE INVENTION

The present invention generally relates to the field of testing and diagnostics of the operation of electronic devices, for example in the automotive field.

More in particular, the present invention concerns an electronic monitoring circuit for detecting the variation in the power or current absorbed by one or more electronic devices under test and relates to an electronic system for testing the correct operation of the one or more electronic devices by means of said detection of the variation in the power or current absorbed by the one or more electronic devices.

PRIOR ART

In the automotive sector it is important to carry out diagnostics of electronic circuits during their normal operation in order to verify their correct operation.

This is done by inserting several dedicated circuits that are able to detect only the presence of short circuits or if components or electronic circuits are present which are switched off.

The Applicant has observed that this known technique has the disadvantage of requiring the use of dedicated circuits for each part of the circuit under test, thus increasing the space occupancy, complexity and cost of the system.

BRIEF SUMMARY OF THE INVENTION

The present invention relates to an electronic monitoring circuit for detecting the variation in the power or current absorbed by at least one electronic circuit under test as defined in the enclosed claim 1 and its preferred embodiments described in dependent claims 2 to 5.

The basic idea is to use a PWM (Pulse Width Modulation) control signal already present in the switch mode power supply supplying the at least one electronic circuit under test, then the variation of the pulse width (or the variation of the duty cycle) of said PWM control signal is measured (for example, when the electronic circuit under test is switched on), then by means of said measurement of the variation of the pulse width (or of the duty cycle) it is detected if the at least one electronic circuit under test is not operating correctly (for example, because a fault is present in one of its components).

The Applicant has perceived that the electronic monitoring circuit according to the present invention has the advantage of using a circuit to perform the test of the at least one electronic circuit which is very simple and takes up little space, as it reuses the pulse-width modulation control signal which is already present in the switch mode power supply supplying the at least one electronic circuit under test.

Furthermore, the electronic monitoring circuit according to the invention does not require the use of current reading resistors along the power supply connection, which could alter the system design parameters.

Furthermore, the same electronic monitoring circuit according to the invention may be used to test two or more electronic circuits of different type, provided that they are supplied by a switch mode power supply.

It is also an object of the present invention an electronic control system for testing the operation of an electronic circuit, wherein the electronic test system is defined in the enclosed claim 6 and in the preferred embodiments described in the dependent claims 7 to 10.

According to one embodiment of the invention, the electronic system for testing the operation of an electronic circuit comprises an electronic monitoring circuit for detecting a variation in the power or current absorbed by the electronic circuit under test, comprises a control device connected to the electronic monitoring circuit and adapted to generate a pulse-width modulation control signal, comprises the electronic circuit under test, comprises a switch mode power supply connected at the input with the electronic driving device and at the output with the electronic circuit under test, and comprises a processing unit connected to the electronic monitoring circuit, wherein:

the electronic monitoring circuit comprises an input terminal adapted to receive the pulse-width modulation control signal, said control signal being adapted to control the opening and closing of at least one power switch of the switch mode power supply, comprises a resistor having a first terminal connected to the input terminal, comprises a capacitor having a first terminal connected to a second terminal of the resistor and having a second terminal connected to a low reference voltage, and comprises an output terminal adapted to generate an output signal as a function of the value of the voltage drop at the ends of the capacitor, said output signal being representative of a variation of the pulse width of the pulse-width modulation control signal, in which said variation of the pulse width is a function of the power or current absorbed by the electronic circuit under test;

the switch mode power supply comprises:
an input terminal adapted to receive the pulse-width modulation control signal;
an output terminal adapted to generate a power supply signal of the electronic circuit under test;
at least one power switch adapted to switch between an open and a closed position, as a function of the value of the pulse-width modulation control signal;

the processing unit is adapted to receive as input the signal representative of the variation of the pulse width and generate, as a function of the comparison between the signal representative of the variation of the pulse width and an expected value, a diagnosis signal representative of a correct operation or of an incorrect operation of the electronic circuit under test, wherein said expected value is associated with the power or current absorbed by the electronic circuit under test under a defined operating condition of the electronic circuit under test.

Advantageously, the electronic monitoring circuit comprises a first RC branch composed of said resistor connected in series to said capacitor and comprises a second RC branch composed of a further resistor connected in series to a further capacitor, wherein said output signal is a function of the difference between the value of the voltage drop at the ends of the first capacitor and the value of the voltage drop at the ends of the second capacitor.

BRIEF DESCRIPTION OF THE DRAWINGS

Additional features and advantages of the invention will become more apparent from the description which follows of a preferred embodiment and the variants thereof, provided by way of example with reference to the appended drawings, in which.

DETAILED DESCRIPTION OF THE INVENTION

It should be observed that in the following description, identical or analogous blocks, components or modules are indicated in the figures with the same numerical references, even where they are illustrated in different embodiments of the invention.

Figure 1:
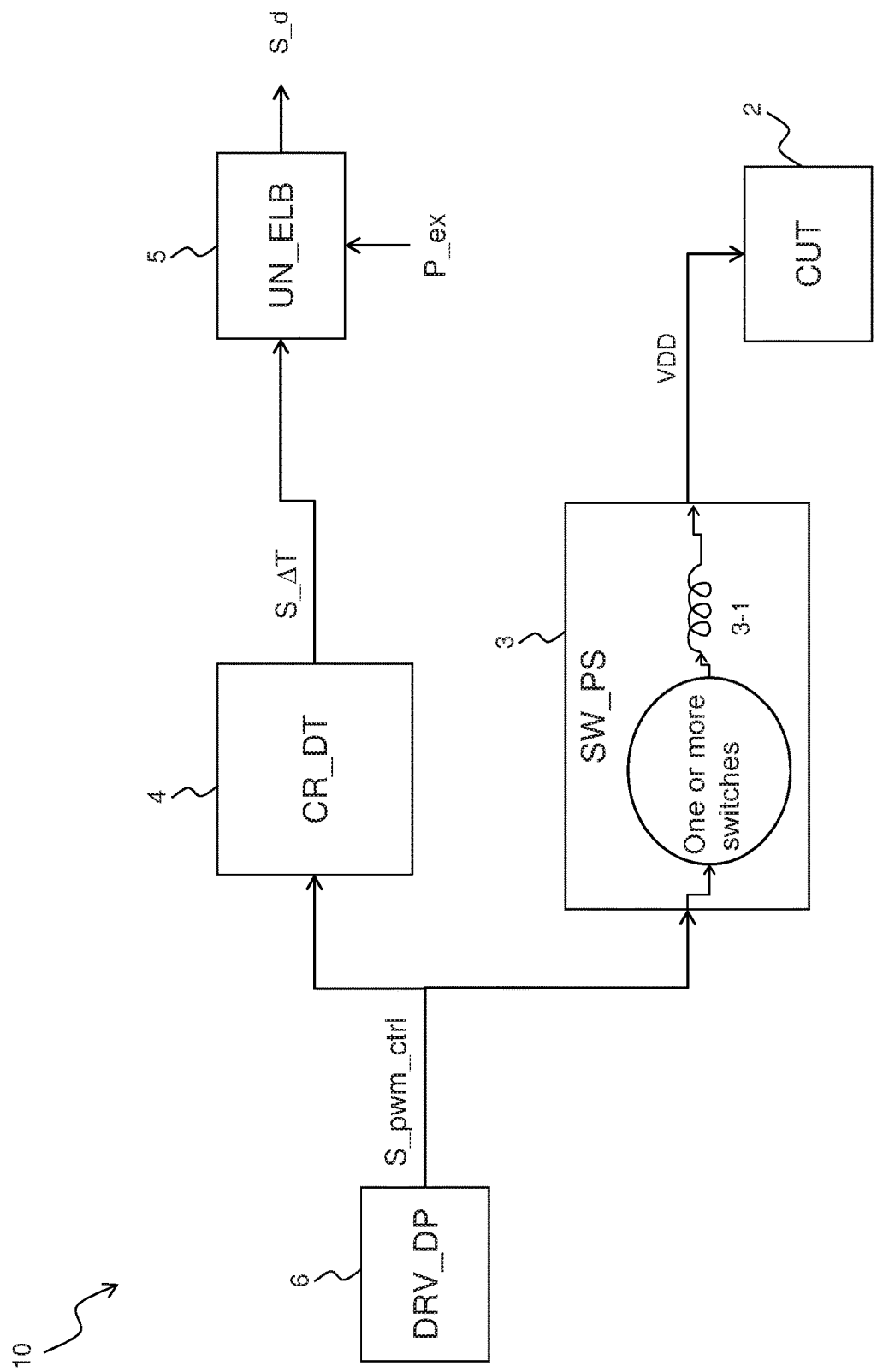
FIG. 1 shows a block diagram of an electronic system for testing the operation of an electronic circuit according to the invention.

Referring to FIG. 1, it shows a block diagram of an electronic system 10 for testing the operation of an electronic circuit 2 according to the invention, in which said test is performed in an operating condition of the electronic circuit 2 which is defined (i.e., a known operating condition).

For example, the test of the operation of the electronic circuit 2 under test is carried out when the electronic circuit 2 under test is activated, i.e., when it switches from a condition in which it is not powered to a condition in which it is powered (e.g., in the automotive field when the motor vehicle is switched on after a condition in which it is switched off).

Note that more generally the invention is applicable to the testing of one or more electronic devices, but for the sake of simplicity for the purpose of the explanation of the invention, only one electronic circuit 2 under test will be considered.

The electronic system 10 has the function of performing a self-diagnosis of the electronic circuit 2 under test in a defined (i.e., known) operating condition, such as when it is activated.

The electronic circuit 2 under test is for example used in the automotive field and thus it is a component mounted on a motor vehicle, in particular it could be for example one of the following components: a driving circuit for a power converter, a voltage or current sensor, a control logic circuit.

The electronic system 10 is such to generate a diagnosis signal S_d representative of a correct operation or of an incorrect operation of the electronic circuit 2 under test.

The electronic system 10 comprises:
- an electronic driving device 6;
- an electronic monitoring circuit 4 connected to the electronic driving device 6;
- a switch mode power supply 3 connected to the electronic driving device 6;
- the electronic circuit 2 under test connected to the switch mode power supply 3;
- a processing unit 5 connected to the electronic monitoring circuit 4.

The electronic driving device 6 has the function of generating the control signal S_pwm_ctrl of the pulse-width modulation (PWM) type, which is used by the switch mode power supply 3 to control the periodic opening and closing of one or more power switches inside the switch mode power supply 3.

In particular, the control signal S_pwm_ctrl is a periodic pulsed signal (with a typically square wave trend, see FIGS. 3A and 3B) and having a duty cycle which can vary over time (both increasing and decreasing), in which the duty cycle refers to the ratio between the temporal width of the portion of each pulse when it is active (i.e., when the pulse of the control signal S_pwm_ctrl has a high value) and the total duration of the same period of the control signal S_pwm_ctrl.

For example, in the case of an application in the automotive industry, the driving device 6 is positioned inside the DC/DC battery charger.

The control signal S_pwm_ctrl is also used by the electronic monitoring circuit 4, as will be explained in more detail later.

The switch mode power supply 3 has the function of providing the supply voltage and current of the electronic circuit 2 under test.

The term "switch mode power supply" (or "switch mode converter") means an electronic device which provides supply voltage and current to another electronic device or circuit using one or more power switches which periodically switch between an open position (where they are substantially equivalent to an open circuit) and a closed position (where they are substantially equivalent to a short circuit) as a function of suitable pulse-width modulation (PWM) control signals, wherein the output voltage generated is controlled by means of the variation of the duty cycle of said PWM control signals.

The power switches are typically implemented with MOSFET-type or bipolar junction transistors.

The switch mode power supply 3 is connected at the input to the electronic driving device 6 and at the output to the electronic circuit 2 under test.

Figure 3A:
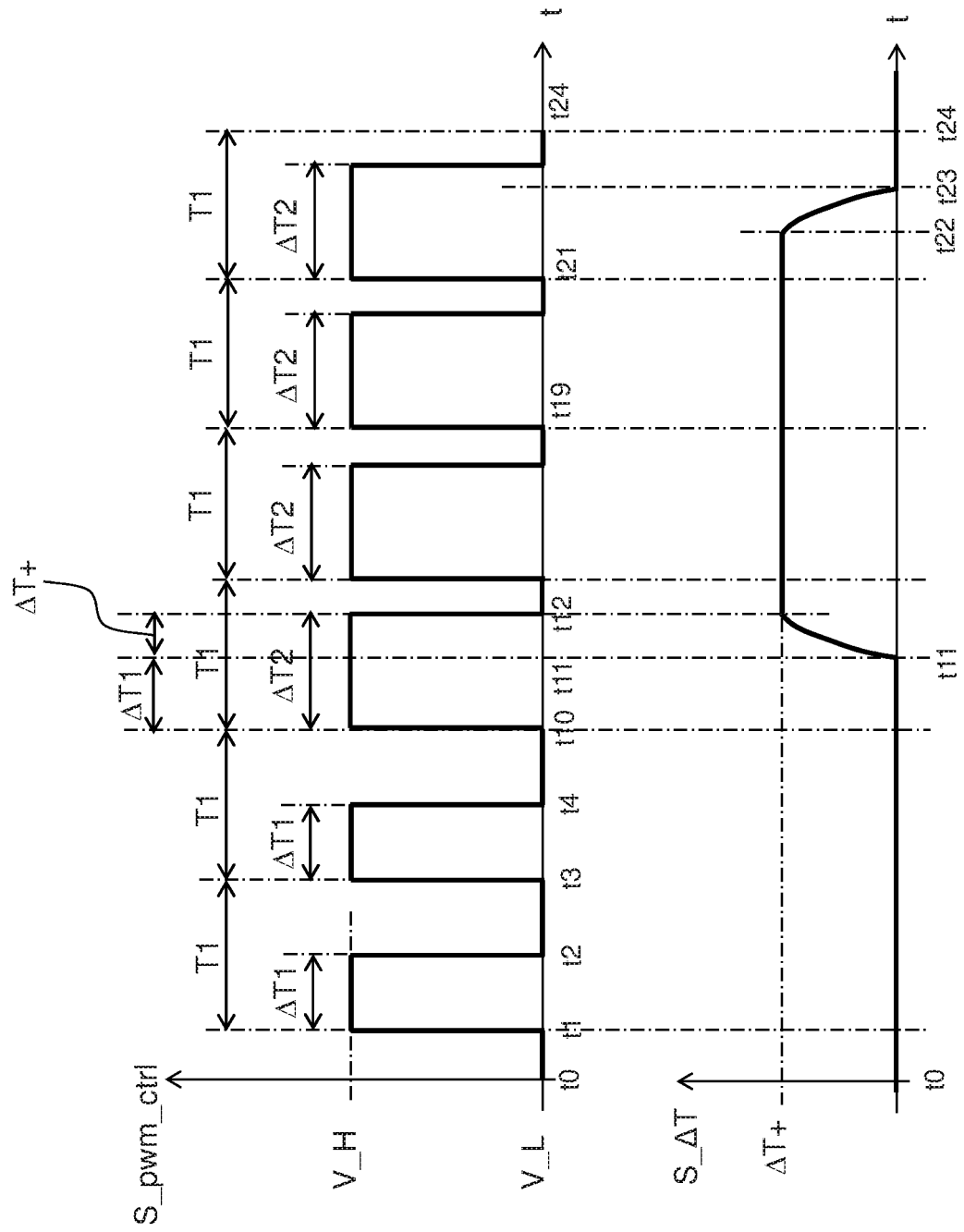
FIG. 3A schematically shows a possible trend of two signals used in the amplification system of FIG. 1 and in the electronic monitoring circuit of FIG. 2.
Figure 3B:
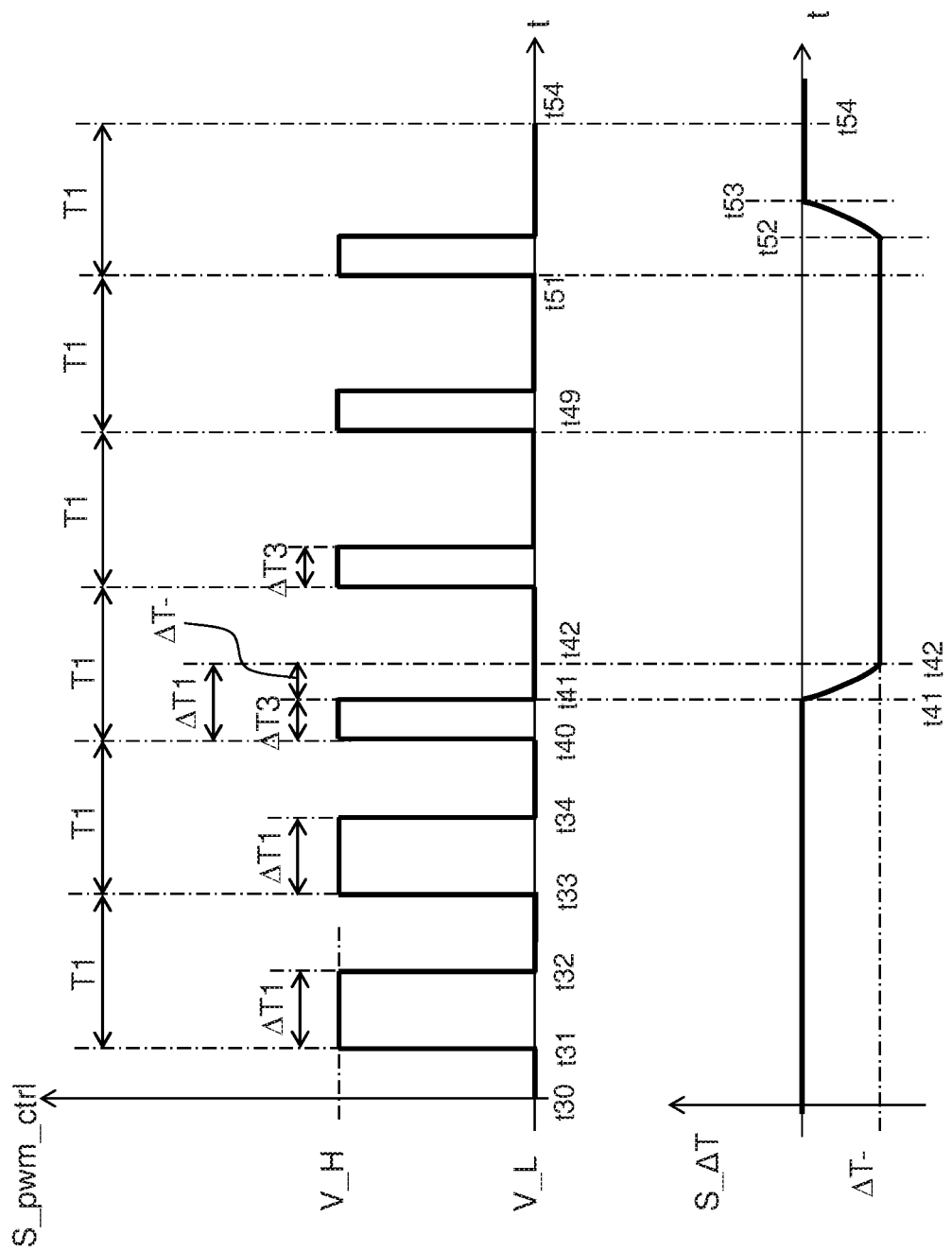
FIG. 3B schematically shows another possible trend of two signals used in the amplification system of FIG. 1 and in the electronic system of FIG. 2.

In particular, the switch mode power supply 3 comprises an input terminal adapted to receive a control signal S_pwm_ctrl of the pulse-width modulation type, having a periodic trend such as for example shown in FIGS. 3A and 3B in which the period is indicated with T1 and the pulse width is indicated with $\Delta T1$, $\Delta T2$, $\Delta T3$.

The switch mode power supply 3 further comprises an output terminal adapted to generate a voltage signal VDD for supplying the electronic circuit 2 under test.

Therefore the switch mode power supply 3 comprises at least one or more switches which are configured to switch between an open and a closed position, as a function of the value of the pulse-width modulation control signal S_pwm_ctrl.

The switch mode power supply 3 further comprises one or more electrical (e.g., capacitors) or magnetic (e.g., inductors, transformers) energy storage components which have the function of storing electrical or magnetic energy and then transferring it in output, generating the desired voltage and/or current value.

Said switches of the switch mode power supply 3 are typically implemented with power transistors, for example of the MOSFET or bipolar junction type.

The switch mode power supply 3 is for example a direct-direct voltage converter adapted to receive a direct voltage as input and to generate a direct voltage as output having a different value (for example lower) with respect to that input.

For example, in the case of application in the automotive field, the switch mode power supply 3 is a direct-direct voltage converter which receives the battery voltage equal to 12 Volts as input and generates a supply voltage equal to 5 Volts or 3.3 Volts as output, which is used to supply the electronic circuits mounted in the motor vehicle, in particular the circuits positioned inside the DC/DC battery charger.

An example of a direct-direct converter which can be used as a switch mode power supply 3 in the automotive field for hybrid vehicles is for example disclosed in the European patent application with publication number 1677410, in which (see FIG. 1) switches 1, 2, 3, 4 are present on the high voltage side, which are controlled respectively by the signals Vg(1), Vg(2), Vg(3), Vg(4) (see FIG. 4).

The electronic monitoring circuit 4 has the function of detecting a variation in the power or current absorbed by the electronic circuit 2 under test, in order to detect if the electronic circuit 2 under test operates correctly or if it operates incorrectly (e.g., because there is a fault of one of its components).

More in particular, the electronic monitoring circuit 4 is such to detect said variation in the power or current absorbed by the electronic circuit 2 under test by measuring the variation of the pulse width (i.e., the variation of the duty cycle) of the pulse-width modulation control signal S_pwm_ctrl received as input to the switch mode power supply 3: said variation of the pulse width (i.e., the variation of the duty cycle) of the control signal S_pwm_ctrl has been indicated with $\Delta T+$ and $\Delta T-$ in FIGS. 3A-3B, respectively.

Therefore the electronic monitoring circuit 4 is connected at the input to the electronic driving device 6 and at the output to the processing unit 5.

In particular, the electronic monitoring circuit 4 comprises an input terminal adapted to receive the pulse-width modulation control signal S_pwm_ctrl and comprises an output terminal adapted to generate an output signal S_$\Delta$T representative of a variation of the pulse width (or of its duty cycle) of the pulse-width modulation control signal S_pwm_ctrl (see FIGS. 3A and 3B, diagram below), in which said variation of the duty cycle is a function of the power or current absorbed by the electronic circuit 2 under test.

For example, FIG. 3A shows that at the instant t3 the pulse of the pulse-width modulation control signal S_pwm_ctrl has a width $\Delta T1$ (time interval of the portion of the period T1 in which it has a high value), then in the period following the instant t10 the pulse of the pulse-width modulation control signal S_pwm_ctrl has a width $\Delta T2$ greater than $\Delta T1$, i.e., at the instant t10 the pulse of the pulse-width modulation control signal S_pwm_ctrl has had an increase equal to $\Delta T+$ (i.e., the duty cycle has increased by $\Delta T+/T1$): this represents the condition in which an increase in power or current absorbed by the electronic circuit 2 under test has occurred and such an increase may be indicative of a condition of incorrect operation of the electronic circuit 2 under test, in the case in which said increase $\Delta T+$ is greater than an expected value in a defined (i.e., known) operating condition.

In addition, FIG. 3A shows at the bottom the trend of the output signal S_$\Delta$T which has a zero value between the instants t0 and t11 (as it is assumed that there are no variations in the power absorbed by the electronic circuit 2 under test), so at the instant t11 the output signal S_$\Delta$T begins to have an increasing trend due to the detected increase in the width of the control signal S_pwm_ctrl (caused by an increase in the power absorbed by the electronic circuit 2 under test), then between the instants t11 and t12 the output signal S_$\Delta$T continues to have an increasing trend until reaching the positive value $\Delta T+$ at the instant t12, finally between the instants t12 and t22 the output signal S_$\Delta$T maintains the constant value equal to $\Delta T+$ as it is assumed that no further increases or decreases in the pulse width of the control signal S_pwm_ctrl occur (i.e., no variations in the power absorbed by the electronic circuit 2 under test).

Subsequently, after a few cycles in which the increase $\Delta T+$ of the pulse stabilizes, the output signal S_$\Delta$T returns to having at the instant t23 the same value that it had between the instants t0 and t11 prior to the occurrence of the increase $\Delta T+$ (i.e., the output signal S_$\Delta$T returns to the zero value), since the outputs of the two RC circuits reached the same final value at full speed: in this way, the variation in the power or current absorbed by the electronic circuit 2 under test was detected.

Therefore, the greater the variation of the pulse width of the control signal S_pwm_ctrl over time, the greater the transient difference in electrical potential between the output of the first RC circuit and the output of the second RC circuit at a given instant of time.

Similarly, FIG. 3B shows that at the instant t33 the pulse of the pulse-width modulation control signal S_pwm_ctrl has a width $\Delta T1$ (time interval of the portion of the period T1 in which it has a high value), then in the period following the instant t40 the pulse of the pulse-width modulation control signal S_pwm_ctrl has a width $\Delta T3$ less than $\Delta T1$, i.e., between the instant t40 and t41 the pulse of the pulse-width modulation control signal S_pwm_ctrl has had a decrease equal to $\Delta T-$ (i.e., the duty cycle has decreased by $\Delta T-/T1$): this represents the condition in which a decrease in the power or current absorbed by the electronic circuit 2 under test has occurred and such decrease may be indicative of a condition of incorrect operation of the electronic circuit 2 under test, in case said decrease $\Delta T-$ is greater (in absolute value) than an expected value in a defined (i.e., known) operating condition.

In addition, FIG. 3B shows at the bottom the trend of the output signal S_$\Delta$T which has a zero value between the instants t30 and t41 (since it is assumed that there are no variations in the power absorbed by the electronic circuit 2 under test), then at the instant t41 the output signal S_$\Delta$T begins to have a decreasing trend due to the detected decrease in the width of the control signal S_pwm_ctrl (caused by a decrease in the power absorbed by the electronic circuit 2 under test), then between the instants t41 and t42 the output signal S_$\Delta$T continues to have a decreasing trend until reaching the negative value $\Delta T-$ at the instant t42, finally between the instants t42 and t52 the output signal S_$\Delta$T maintains the constant value equal to $\Delta T-$ since it is assumed that no further increases or decreases in the pulse width of the control signal or S_pwm_ctrl occur (i.e., no variations in the power absorbed by the electronic circuit 2 under test).

Subsequently, after a few cycles in which the decrease $\Delta T-$ of the pulse stabilizes, the output signal S_$\Delta$T returns to having at the instant t53 the same value that it had between the instants t30 and t41 prior to the occurrence of the decrease $\Delta T-$ (that is, the output signal S_$\Delta$T returns to the zero value), since the outputs of the two RC circuits reached the same final value at full speed: in this way, the variation in the power or current absorbed by the electronic circuit 2 under test was detected.

The processing unit 5 (e.g., a microprocessor or programmable electronic device) is connected to the electronic monitoring circuit 4 and is such to receive therefrom a signal S_ΔT representative of the variation of the pulse width (or of the duty cycle) of the pulse-width modulation control signal S_pwm_ctrl, in which said variation of the pulse width (or of the duty cycle) is a function of the power or current absorbed by the electronic circuit 2 under test.

The processing unit 5 has the function of generating the diagnosis signal S_d representative of a correct operation or of an incorrect operation of the electronic circuit 2 under test, as a function of the comparison between the signal S_ΔT representative of the variation of the pulse width (or of its duty cycle) of the control signal S_pwm_ctlr and an expected value P_ex associated with the power or current absorbed by the electronic device 2 in a defined (i.e. known) operating condition of the electronic circuit 2 under test.

For example, the diagnosis signal S_d is a logic signal which has a low logic value indicating a correct operation of the electronic circuit 2 under test and a high logic value indicating an incorrect operation of the electronic circuit 2 under test.

An example of the expected value P_ex is that of a range of expected values defined as a function of the maximum variation in the power absorbed by the electronic circuit 2 under test, that is, the maximum variation in power that the electronic circuit 2 under test can absorb under a defined (i.e., known) operating condition: in this case, the processing unit 5 generates the diagnosis signal S_d having a value indicative of a correct operation of the electronic circuit 2 under test (e.g., a low logic value) in the case in which the value of the variation ΔT+/ΔT− of the signal S_ΔT has a value which is within said range of expected values, while the processing unit 5 generates the diagnosis signal S_d having a value indicative of an incorrect operation of the electronic circuit 2 under test (e.g., a high logic value) in the case in which the value of the variation ΔT+/ΔT− of the signal S_ΔT has a value which is outside said range of expected values.

Figure 2:
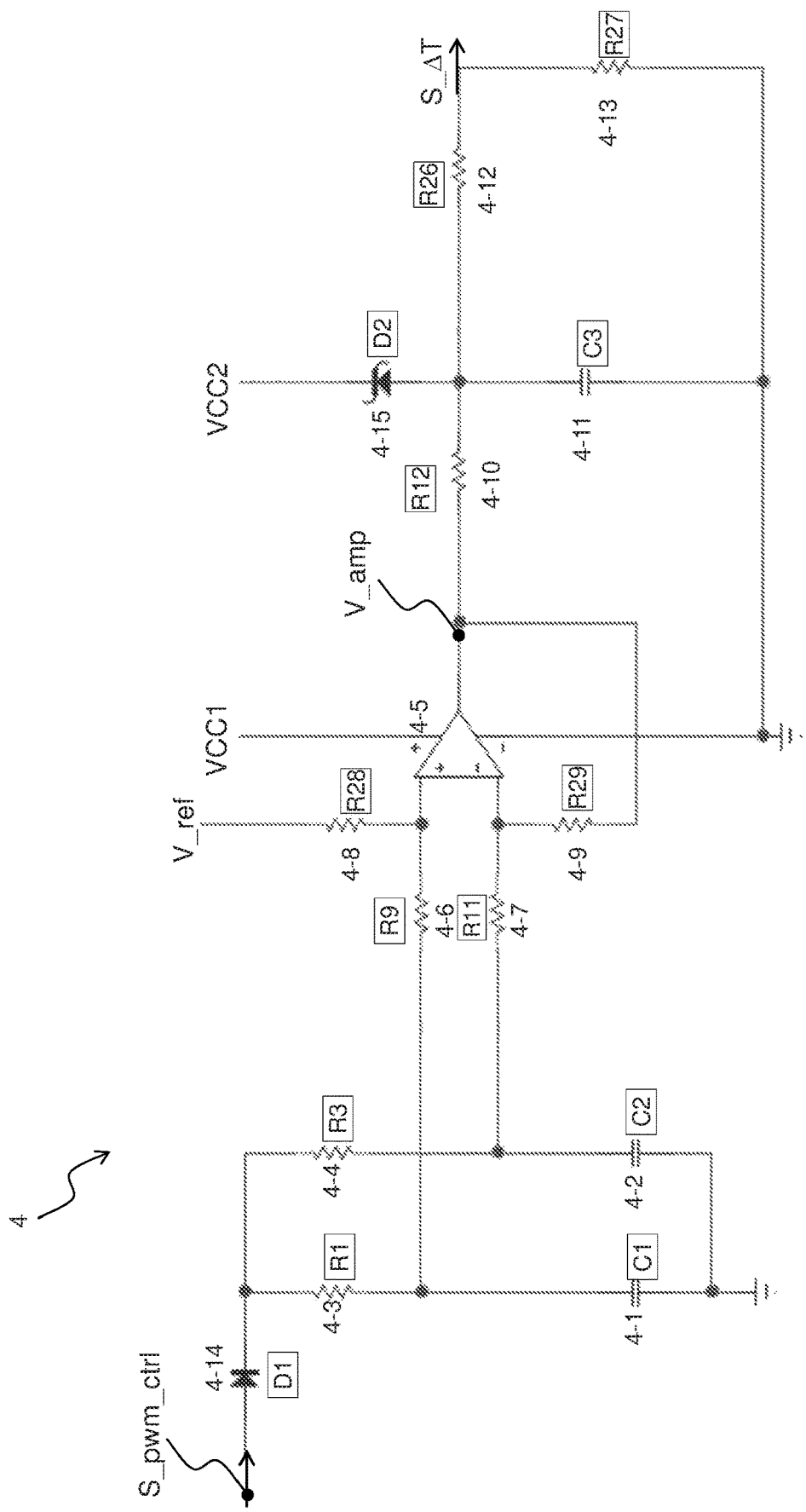
FIG. 2 schematically shows an electronic monitoring circuit included in the system of FIG. 1, having the function of detecting a variation in the power or current absorbed by the electronic circuit under test.

More in particular, the electronic monitoring circuit 4 comprises the following components, which are electrically connected as shown in FIG. 2:

a first RC circuit;
a second RC circuit;
a resistor 4-6;
a resistor 4-7;
a differential amplifier 4-5;
a feedback resistor 4-9;
a resistor 4-8;
a resistor 4-10;
a capacitor 4-11;
a resistor 4-12;
a resistor 4-13.

The first RC circuit (i.e., a first RC branch) comprises the connection in series of a resistor 4-3 and of a first capacitor 4-1, in which said series connection is connected between the input terminal and the ground reference voltage.

During a transitory phase between the instant (t10 or t40) at which the variation ΔT+/ΔT− of the pulse width (or of its duty cycle) of the control signal S_pwm_ctrl begins and the final instant (t12 or t41) at which the full-speed value of said variation ΔT+/ΔT− of the pulse width (or of its duty cycle) of the control signal S_pwm_ctrl is reached, the first RC circuit has the function of detecting the trend over time of the variation ΔT+/ΔT− of the pulse width (or of its duty cycle) of the control signal S_pwm_ctrl with a first time constant $\tau1=R1 \times C1$, by detecting the trend of the voltage drop at the ends of the capacitor C1.

The second RC circuit (i.e., a second RC branch) comprises the connection in series of a resistor 4-4 and a second capacitor 4-2, in which said series connection is connected between the input terminal and the ground reference voltage.

Similarly, during the same transitory phase between the instant (t10 or t40) at which the variation ΔT+/ΔT− of the pulse width (or its duty cycle) of the control signal S_pwm_ctrl begins and the final instant (t12 or t41) at which the full-speed value of said variation ΔT+/ΔT− of the pulse width (or its duty cycle) of the control signal S_pwm_ctrl is reached, the second RC circuit has the function of detecting the trend over time of the variation ΔT+/ΔT− of the pulse width (or of its duty cycle) of the control signal S_pwm_ctrl with a second time constant $\tau2=R2 \times C2$ (different from the first time constant $\tau1=R1 \times C1$), by detecting the trend of the voltage drop at the ends of the capacitor C2.

The output of the first RC circuit is the voltage drop at the ends of the first capacitor 4-1 (i.e., the terminal voltage common to the resistor 4-3 and the capacitor 4-1) and the output of the first RC circuit is connected to the first input terminal of the differential amplifier 4-5 by means of the resistor 4-6.

The output of the second RC circuit is the voltage drop at the ends of the second capacitor 4-2 (i.e., the terminal voltage common to the resistor 4-4 and the second capacitor 4-2) and the output of the second RC circuit is connected to the second input terminal of the differential amplifier 4-5 by means of the resistor 4-7.

The set of the first RC circuit, of the second RC circuit and of the differential amplifier 4-5 have the function of processing, during a transitory phase, the variation ΔT+/ΔT− of the pulse width (or of its duty cycle) of the control signal S_pwm_ctrl with different timings between the first RC circuit and the second RC circuit, in order to effectively catch (during the transitory phase) the difference of the variation of the pulse width (or of its duty cycle) detected by means of the first and second RC circuits as it occurs in a short interval of time (in the order of hundreds of microseconds), according to the following two possible solutions:

the value of the resistance R1 of the resistor 4-3 of the first RC circuit is equal to the value of the resistance R3 of the resistor 4-4 of the second RC circuit, while the value of the capacitance C1 of the first capacitor 4-1 is different from the value of the capacitance C2 of the second capacitor 4-2 (for example, R1=R3=10 Kilo Ohm, C1=5 nano Farad, C2=560 nano Farad): in this case the variation of the pulse width (or of its duty cycle) of the pulse-width modulation control signal S_pwm_ctrl is proportional (in the transitory phase) to the difference between the values of the capacitances C1 and C2 of the capacitors 4-1 and 4-2;

the value of the resistance R1 of the resistor 4-3 is different from the value of the resistance R3 of the resistor 4-4, while the value of the capacitance C1 of the first capacitor 4-1 is equal to the value of the capacitance C2 of the second capacitor 4-2: in this case the variation of the pulse width (or of its duty cycle) of the pulse-width modulation control signal S_pwm_ctrl is proportional (in the transitory phase) to the difference between the values of the resistances R1 and R3 of the resistors 4-3 and 4-4.

In both of the above solutions, the greater the variation in time of the duty cycle, the greater the difference between the voltage generated as output from the first RC circuit and the voltage generated as output from the second RC circuit during the transitory phase.

The resistor 4-6 is connected between the terminal common to the first capacitor 4-1 and to the resistor 4-3 and the first input terminal of the differential amplifier 4-5.

The resistor 4-7 is connected between the terminal common to the second capacitor 4-2 and to the resistor 4-4 and the second input terminal of the differential amplifier 4-5.

The value of the resistance R9 of the resistor 4-6 is for example equal to 1 Kilo Ohm and the value of the resistance R11 of the resistor 4-7 is for example equal to 1 Kilo Ohm.

The differential amplifier 4-5 is supplied with a first supply voltage VCC1, equal for example to 5 Volts.

The differential amplifier 4-5 comprises a first input terminal connected to the resistor 4-6, comprises a second input terminal connected to the resistor 4-7, and comprises an output terminal adapted to generate an amplified voltage signal V_ampl as a function of the difference between the voltage of the first and of the second input terminals.

The differential amplifier 4-5 has the function of amplifying the difference between the voltage of the first and of the second input terminals.

The differential amplifier 4-5 is made for example as an operational amplifier.

The resistor 4-8 is connected between a reference voltage V_ref (e.g., equal to 1.65 Volts) and the first input terminal of the differential amplifier 4-5.

For example, the value of the resistance R28 of the resistor 4-8 is equal to 100 Kilo Ohm.

The feedback resistor 4-9 is connected between the second input terminal and the output terminal of the differential amplifier 4-5.

The value of the resistance R29 of the feedback resistor 4-9 is for example equal to 100 Kilo Ohm.

The resistor 4-10 comprises a first terminal connected to the output terminal of the differential amplifier 4-5.

For example, the value of the resistance R12 of the resistor 4-10 is equal to 200 Ohms.

The capacitor 4-11 is connected between the second terminal of the resistor 4-10 and the ground reference voltage.

The value of the capacitance C3 of the capacitor 4-11 is for example equal to 220 nano Farad.

The resistor 4-12 is connected between the second terminal of the resistor 4-10 and the output terminal.

The resistor 4-13 is connected between the second terminal of the resistor 4-12 and the ground reference voltage.

A Zener diode 4-15 is connected between a second supply voltage VCC2 and the terminal common to the resistors 4-10 and 4-12.

Preferably, the electronic monitoring circuit 4 comprises a diode 4-14 interposed between the input terminal and the resistors 4-3, 4-4; the diode 4-14 comprises the anode terminal connected to the input terminal of the electronic monitoring circuit 4 and the cathode terminal connected to the resistor 4-6 and to the resistor 4-7.

Note that FIG. 2 shows an electronic monitoring circuit 4 in which there are two RC circuits, in order to detect (during the transitory phase) the difference between the variation (measured by the voltage drop at the ends of the first capacitor 4-1 of the first RC circuit) of the pulse width (or of its duty cycle) of the control signal S_pwm_ctrl and the variation (measured by the voltage drop at the ends of the second capacitor 4-2 of the second RC circuit) of the pulse width (or of its duty cycle) of the control signal S_pwm_ctrl.

However, the invention can also be implemented using a single RC circuit (for example, the connection in series of the resistor 4-3 and of the capacitor 4-1, i.e., without the capacitor 4-2 and the resistor 4-4), thus detecting the absolute value at full speed of the variation ΔT+ (increase) or ΔT− (decrease) of the pulse width (or of its duty cycle) of the control signal S_pwm_ctrl.

It should also be noted that for the purpose of the explanation of the invention, a differential amplifier 4-5 has been considered, but other electronic components can also be used.

It should also be noted that for the purpose of the explanation of the invention, only one electronic circuit 2 under test has been considered, but more generally the invention is also applicable to two or more electronic circuits under test (i.e., to two or more portions of the same electronic circuit): in this case the two or more circuits (or two or more circuit portions) are activated in sequence and for each of them the variation of the pulse width (or of its duty cycle) of the respective pulse-width modulation control signals is measured under respective defined operating conditions (i.e., known).

Note that the invention can also be made entirely in software, using a microprocessor instead of the electronic monitoring circuit 4, provided that a microprocessor with a sufficiently high computing power is available which is able to catch, in each period of the control signal S_pwm_ctrl, the variation of the pulse width (or of its duty cycle) of the pulse-width modulation control signal S_pwm_ctrl.

The invention claimed is:

1. An electronic monitoring circuit for detecting a variation in a power or a current absorbed by an electronic circuit under test, the electronic monitoring circuit comprising:
   an input terminal configured to receive a pulse-width modulation control signal, wherein said control signal is configured to control opening and closing of at least one power switch of a switch mode power supply of the electronic circuit under test;
   a resistor having a first terminal connected to the input terminal;
   a capacitor having a first terminal connected to a second terminal of the resistor and having a second terminal connected to a low reference voltage; and
   an output terminal configured to generate an output signal as a function of value of the voltage drop between the terminals of the capacitor, said output signal being representative of a variation in the pulse width of the pulse-width modulation control signal, wherein said variation in the pulse width is a function of power or current absorbed by the electronic circuit under test,
   the electronic monitoring circuit further comprising:
   a further resistor having a first terminal connected to the input terminal;
   a further capacitor having a first terminal connected to a second terminal of the further resistor and having a second terminal connected to the low reference voltage;
   wherein:
   the output terminal of the electronic monitoring circuit is configured to generate the output signal as a function of the difference between the value of the voltage drop between the terminals of the capacitor and the value of the voltage drop between the terminals of the further capacitor;
   and wherein, alternatively:
   the resistance value is equal for said resistor and said further resistor and the capacitance value differs between said capacitor and said further capacitor;
   the resistance value differs between said resistor and said further resistor and the capacitance value is equal for said capacitor and said further capacitor.

2. The electronic monitoring circuit according to claim 1, further comprising a differential amplifier having:
   a first input terminal connected to a terminal common to the capacitor and the resistor;

a second input terminal connected to a terminal common to the further capacitor and the further resistor;

an output terminal configured to generate an amplified voltage signal equal to the difference between the voltage drop between the terminals of the first capacitor and the voltage drop between the terminals of the second capacitor;

wherein the output terminal of the electronic monitoring circuit is configured to generate the output signal as a function of the amplified voltage signal.

3. The electronic monitoring circuit according to claim 2, wherein said differential amplifier is an operational amplifier, the electronic monitoring circuit further comprising:

a first resistor connected between the terminal common to the resistor and the capacitor and the first input terminal of the operational amplifier;

a second resistor connected between the terminal common to the further resistor and the further capacitor and the second input terminal of the operational amplifier;

a bias resistor connected between the first input terminal of the operational amplifier and a reference voltage; and a feedback resistor connected between the output terminal and the second input terminal of the operational amplifier.

4. The electronic monitoring circuit according to claim 3, further comprising:

a third resistor having a first terminal connected to the output terminal of the amplifier;

a capacitor connected between a second terminal of the third resistor and the low reference voltage;

a fourth resistor connected between the second terminal of the third resistor and the output terminal; and a fifth resistor connected between the output terminal and the low reference voltage.

5. An electronic system for testing the operation of an electronic circuit, the system comprising:

an electronic monitoring circuit for detecting a variation in the power or current absorbed by an electronic circuit under test, the electronic monitoring circuit comprising;

an input terminal configured to receive a pulse-width modulation control signal, wherein said control signal is configured to control opening and closing of at least one power switch of a switch mode power supply of the electronic circuit under test;

a resistor having a first terminal connected to the input terminal;

a capacitor having a first terminal connected to a second terminal of the resistor and having a second terminal connected to a low reference voltage; and an output terminal configured to generate an output signal as a function of value of the voltage drop between the terminals of the capacitor, said output signal being representative of a variation in the pulse width of the pulse-width modulation control signal, wherein said variation in the pulse width is a function of power or current absorbed by the electronic circuit under test;

a driving device connected to the electronic monitoring circuit and configured to generate the pulse-width modulation control signal;

the electronic circuit under test;

a switch mode power supply connected at the input to the electronic driving device and at the output to the electronic circuit under test, the switch mode power supply comprising:

an input terminal configured to receive the pulse-width modulation control signal;

an output terminal configured to generate a power supply signal of the electronic circuit under test; and at least one power switch configured to switch between an open and a closed position, as a function of the value of the pulse-width modulation control signal;

a processing unit connected to the electronic monitoring circuit, the processing unit being configured to receive as input the signal representative of the variation of the pulse width and generate, as a function of the comparison between the signal representative of the variation of the pulse width and an expected value, a diagnosis signal representative of a correct operation or of an incorrect operation of the electronic circuit under test, wherein said expected value is associated with the power or current absorbed by the electronic circuit under test under a defined operating condition of the electronic circuit under test, the electronic monitoring circuit comprising:

a further resistor having a first terminal connected to the input terminal;

a further capacitor having a first terminal connected to a second terminal of the further resistor and having a second terminal connected to the low reference voltage;

wherein:

the output terminal of the electronic monitoring circuit is configured to generate the output signal as a function of the difference between the value of the voltage drop between the terminals of the capacitor and the value of the voltage drop between the terminals of the further capacitor;

and wherein, alternatively:

the resistance value is equal for said resistor and said further resistor and the capacitance value differs between said capacitor and said further capacitor;

the resistance value differs between said resistor and said further resistor and the capacitance value is equal for said capacitor and said further capacitor.

6. The electronic system according to claim 5, wherein:

said variation of the pulse width is an increase representative of a rise in the power or current absorbed by the electronic circuit under test;

said variation in the pulse width is a decrease representative of a reduction in the power or current absorbed by the electronic circuit under test.

7. The electronic system according to claim 5, wherein said expected value is calculated under a condition of activation of the electronic circuit under test.

8. The electronic system according to claim 5, wherein the power circuit is a DC-DC voltage converter comprising:

at least one switch periodically switching from an open and a closed position as a function of the value of the pulse-width modulation control signal; and at least one inductor configured to generate a power supply current of the electronic circuit under test.

9. The electronic system according to claim 5, further comprising a plurality of electronic circuits under test, and wherein the processing unit is configured to:

activate sequentially the electronic circuits of said plurality;

for each electronic circuit under test of said plurality, receive as input the signal representative of the variation of the pulse width and generate, as a function of the comparison between the signal representative of the variation of the pulse width and a respective expected value, the diagnosis signal representative of a correct operation or of an incorrect operation of the respective electronic circuit under test, wherein said respective expected value is associated with the power or current absorbed by the respective electronic circuit under test under a defined operating condition of the respective electronic circuit under test.

10. The electronic system according to claim 5, further comprising a differential amplifier having:
   a first input terminal connected to a terminal common to the capacitor and the resistor;
   a second input terminal connected to a terminal common to the further capacitor and the further resistor;
   an output terminal configured to generate an amplified voltage signal equal to the difference between the voltage drop between the terminals of the first capacitor and the voltage drop between the terminals of the second capacitor;
   wherein the output terminal of the electronic monitoring circuit is configured to generate the output signal as a function of the amplified voltage signal.

11. The electronic system according to claim 10, wherein said differential amplifier is an operational amplifier, the electronic monitoring circuit further comprising;
   a first resistor connected between the terminal common to the resistor and the capacitor and the first input terminal of the operational amplifier;
   a second resistor connected between the terminal common to the further resistor and the further capacitor and the second input terminal of the operational amplifier;
   a bias resistor connected between the first input terminal of the operational amplifier and a reference voltage; and
   a feedback resistor connected between the output terminal and the second input terminal of the operational amplifier.

12. The electronic system according to claim 11, further comprising:
   a third resistor having a first terminal connected to the output terminal of the amplifier;
   a capacitor connected between a second terminal of the third resistor and the low reference voltage;
   a fourth resistor connected between the second terminal of the third resistor and the output terminal;
   a fifth resistor connected between the output terminal and the low reference voltage.

13. The electronic system according to claim 6, wherein said expected value is calculated under a condition of activation of the electronic circuit under test.

14. The electronic system according to claim 6, further comprising a plurality of electronic circuits under test,
   and wherein the processing unit is configured to:
      activate sequentially the electronic circuits of said plurality;
      for each electronic circuit under test of said plurality, receive as input the signal representative of the variation of the pulse width and generate, as a function of the comparison between the signal representative of the variation of the pulse width and a respective expected value, the diagnosis signal representative of a correct operation or of an incorrect operation of the respective electronic circuit under test, wherein said respective expected value is associated with the power or current absorbed by the respective electronic circuit under test under a defined operating condition of the respective electronic circuit under test.

15. The electronic system according to claim 7, further comprising a plurality of electronic circuits under test,
   and wherein the processing unit is configured to:
      activate sequentially the electronic circuits of said plurality;
      for each electronic circuit under test of said plurality, receive as input the signal representative of the variation of the pulse width and generate, as a function of the comparison between the signal representative of the variation of the pulse width and a respective expected value, the diagnosis signal representative of a correct operation or of an incorrect operation of the respective electronic circuit under test, wherein said respective expected value is associated with the power or current absorbed by the respective electronic circuit under test under a defined operating condition of the respective electronic circuit under test.

16. The electronic system according to claim 8, comprising a plurality of electronic circuits under test,
   and wherein the processing unit is configured to:
      activate sequentially the electronic circuits of said plurality;
      for each electronic circuit under test of said plurality, receive as input the signal representative of the variation of the pulse width and generate, as a function of the comparison between the signal representative of the variation of the pulse width and a respective expected value, the diagnosis signal representative of a correct operation or of an incorrect operation of the respective electronic circuit under test, wherein said respective expected value is associated with the power or current absorbed by the respective electronic circuit under test under a defined operating condition of the respective electronic circuit under test.

17. The electronic system according to claim 13, comprising a plurality of electronic circuits under test,
   and wherein the processing unit is configured to:
      activate sequentially the electronic circuits of said plurality;
      for each electronic circuit under test of said plurality, receive as input the signal representative of the variation of the pulse width and generate, as a function of the comparison between the signal representative of the variation of the pulse width and a respective expected value, the diagnosis signal representative of a correct operation or of an incorrect operation of the respective electronic circuit under test, wherein said respective expected value is associated with the power or current absorbed by the respective electronic circuit under test under a defined operating condition of the respective electronic circuit under test.

\* \* \* \* \*